United States Patent
Stehning et al.

(10) Patent No.: US 10,241,182 B2
(45) Date of Patent: Mar. 26, 2019

(54) MOTION DETECTION AND CORRECTION METHOD FOR MAGNETIC RESONANCE DIFFUSION WEIGHTED IMAGING (DWI)

(71) Applicant: KONINKLIJKE PHILIPS N.V., Eindhoven (NL)

(72) Inventors: Christian Stehning, Hamburg (DE); Thomas Perkins, Bothell, WA (US); Julien Senegas, Hamburg (DE); Jochen Keupp, Hamburg (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 754 days.

(21) Appl. No.: 14/651,496

(22) PCT Filed: Dec. 6, 2013

(86) PCT No.: PCT/IB2013/060691
§ 371 (c)(1),
(2) Date: Jun. 11, 2015

(87) PCT Pub. No.: WO2014/091374
PCT Pub. Date: Jun. 19, 2014

(65) Prior Publication Data
US 2015/0316635 A1    Nov. 5, 2015

Related U.S. Application Data
(60) Provisional application No. 61/736,099, filed on Dec. 12, 2012.

(51) Int. Cl.
*G01R 33/483* (2006.01)
*G01R 33/563* (2006.01)
*G01R 33/565* (2006.01)

(52) U.S. Cl.
CPC ... *G01R 33/56341* (2013.01); *G01R 33/4831* (2013.01); *G01R 33/56509* (2013.01)

(58) Field of Classification Search
CPC .......... G01R 33/56341; G01R 33/4831; G01R 33/56509
(Continued)

(56) References Cited

U.S. PATENT DOCUMENTS 5,492,123 A * 2/1996 Edelman .......... G01R 33/56341
                                                        600/410
5,833,609 A * 11/1998 Dannels .......... G01R 33/56341
                                                        324/306
(Continued)

FOREIGN PATENT DOCUMENTS

| JP | 11128202 A | 5/1999 |
|----|------------|--------|
| JP | 2006026076 A | 2/2006 |
| JP | 2008067781 A | 3/2008 |

OTHER PUBLICATIONS

Porter, D.A., 2D-Navigator Based Re-Acquisition for Motion Artefact Suppression in Multi-Shot, Diffusion Weighted Imaging. MR Applications Development, Siemens Medical Solutions, 2006, Proc. Intl.Soc.Mag.Reson.Med.*
(Continued)

*Primary Examiner* — Patrick Assouad
*Assistant Examiner* — Sean Curtis

(57) ABSTRACT

A magnetic resonance imaging system (1) includes at least one processor (28) configured to receive (48) diffusion weighted imaging data based on a diffusion weighted imaging sequence with magnetic gradient fields applied in different directions and with different b-values. The at least one processor (28) is further configured to detect (50) motion corrupted data present in the received imaging data based on a comparison of data redundant in the received data, and
(Continued)

Figure 1:
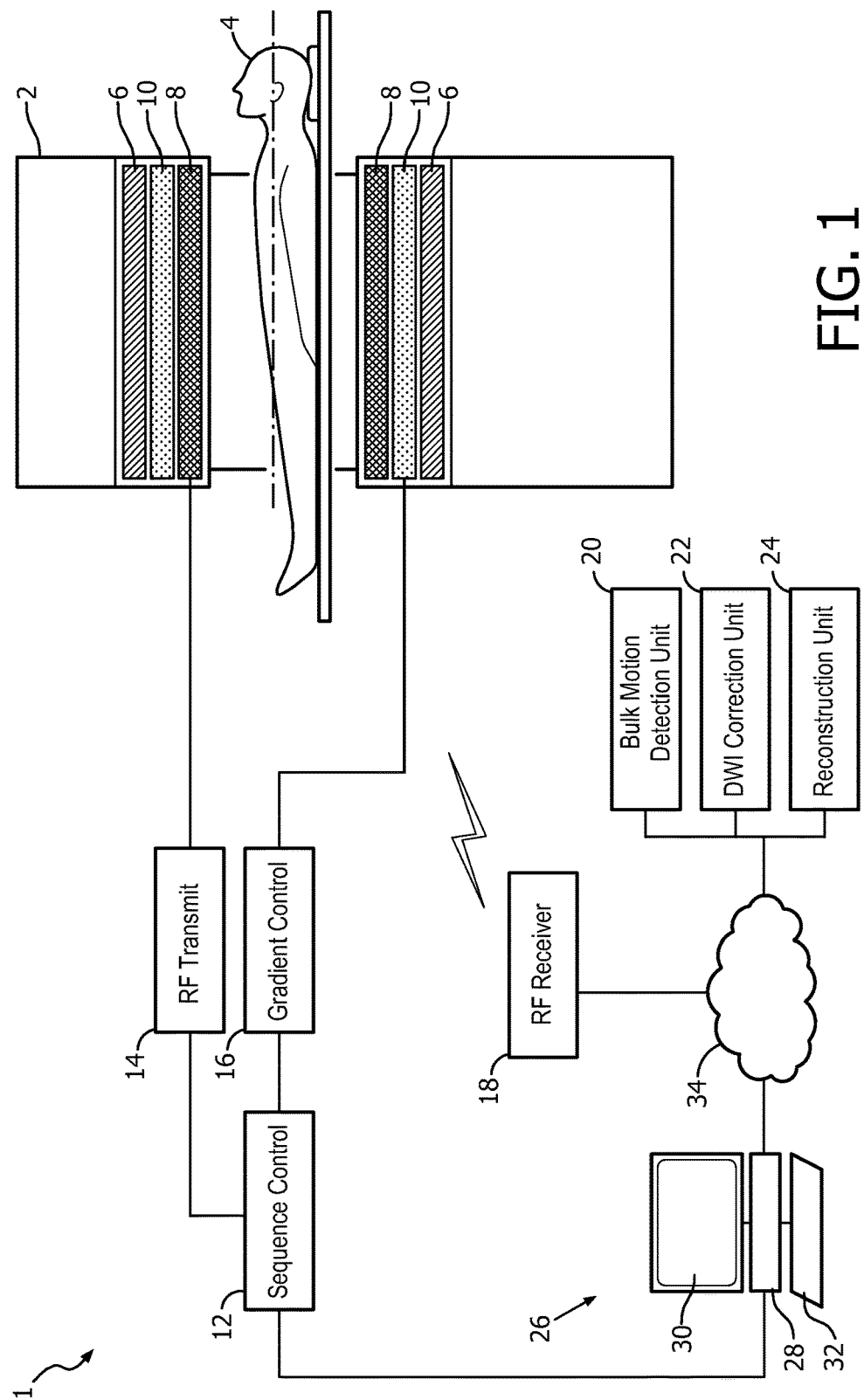

substitute (52) alternative data for detected motion corrupted data.

20 Claims, 3 Drawing Sheets

(58) Field of Classification Search
USPC .................................................. 324/300–322
See application file for complete search history.

(56) References Cited

U.S. PATENT DOCUMENTS

| | | | | |
|---|---|---|---|---|
| 5,864,233 | A * | 1/1999 | Zhou | G01R 33/56341 324/309 |
| 6,076,006 | A * | 6/2000 | Van Den Brink | G01R 33/56341 324/309 |
| 6,433,547 | B2 * | 8/2002 | Kabasawa | G01R 33/56341 324/307 |
| 6,873,395 | B2 * | 3/2005 | Yamada | G06T 7/254 348/407.1 |
| 6,969,991 | B2 * | 11/2005 | Bammer | G01R 33/56341 324/307 |
| 6,992,484 | B2 * | 1/2006 | Frank | G01R 33/56341 324/307 |
| 7,170,289 | B2 * | 1/2007 | Kumai | A61B 5/7257 324/307 |
| 7,174,200 | B2 * | 2/2007 | Salerno | G01R 33/5601 424/9.3 |
| 7,667,460 | B2 * | 2/2010 | Lamerichs | G01R 33/281 324/309 |
| 7,723,987 | B2 * | 5/2010 | Bito | G01R 33/4833 324/307 |
| 7,902,825 | B2 * | 3/2011 | Bammer | G01R 33/56509 324/307 |
| 7,974,451 | B2 * | 7/2011 | Matsumoto | G06T 5/006 128/922 |
| 8,126,212 | B2 * | 2/2012 | Lin | G06T 7/20 382/103 |
| 8,183,865 | B2 * | 5/2012 | Stemmer | G01R 33/56509 324/306 |
| 8,185,186 | B2 * | 5/2012 | Ross | G06T 7/254 382/128 |
| 8,283,925 | B2 * | 10/2012 | Auslender | A61B 5/055 324/309 |
| 8,334,695 | B2 * | 12/2012 | McColl | G01R 33/56509 324/307 |
| 8,395,386 | B2 * | 3/2013 | Kimura | G01R 33/56341 324/307 |
| 8,406,849 | B2 * | 3/2013 | Jeong | G01R 33/5615 600/410 |
| 8,487,617 | B2 * | 7/2013 | Feiweier | G01R 33/56341 324/314 |
| 8,503,752 | B2 * | 8/2013 | Feiweier | G01R 33/56518 382/128 |
| 8,508,226 | B2 * | 8/2013 | Feiweier | G01R 33/44 324/309 |
| 8,565,854 | B2 * | 10/2013 | Bryskhe | A61B 5/055 324/307 |
| 8,638,098 | B2 * | 1/2014 | Feiweier | G01R 33/56509 324/307 |
| 8,717,022 | B2 * | 5/2014 | Han | G01R 33/243 324/309 |
| 8,768,431 | B2 * | 7/2014 | Ross | G06T 7/254 382/128 |
| 8,810,244 | B2 * | 8/2014 | Topgaard | G01R 33/56341 324/309 |
| 8,842,896 | B2 * | 9/2014 | Hajnal | A61B 5/055 382/131 |
| 9,095,302 | B2 * | 8/2015 | Porter | A61B 5/055 |
| 9,097,778 | B2 * | 8/2015 | Bito | G01R 33/485 |
| 9,103,897 | B2 * | 8/2015 | Herbst | G01R 33/5673 |
| 9,207,301 | B2 * | 12/2015 | Kim | G01R 33/56518 |
| 9,250,307 | B2 * | 2/2016 | Huwer | G01R 33/56341 |
| 9,329,252 | B2 * | 5/2016 | Bammer | G01R 33/56 |
| 9,404,986 | B2 * | 8/2016 | White | G01R 33/48 |
| 9,427,171 | B2 * | 8/2016 | Gdaniec | G01R 33/4818 |
| 9,513,358 | B2 * | 12/2016 | Levin | G01R 33/56509 |
| 9,568,580 | B2 * | 2/2017 | Dale | G01R 33/56341 |
| 9,603,546 | B2 * | 3/2017 | Horkay | A61B 5/055 |
| 9,687,172 | B2 * | 6/2017 | Bhat | A61B 5/055 |
| 9,733,328 | B2 * | 8/2017 | Doneva | G01R 33/56 |
| 9,760,993 | B2 * | 9/2017 | Schadewaldt | G06T 7/0012 |
| 9,770,186 | B2 * | 9/2017 | Jeong | G01R 33/5615 |
| 9,886,745 | B2 * | 2/2018 | Chen | G01R 33/543 |
| 9,897,678 | B2 * | 2/2018 | Tan | G01R 33/56572 |
| 2001/0007424 | A1 * | 7/2001 | Kabasawa | G01R 33/56341 324/312 |
| 2004/0095557 | A1 * | 5/2004 | Yamada | H04N 5/145 352/39 |
| 2005/0218893 | A1 * | 10/2005 | Kumai | A61B 5/7257 324/309 |
| 2007/0223832 | A1 * | 9/2007 | Matsumoto | G06T 3/00 382/260 |
| 2007/0249929 | A1 * | 10/2007 | Jeong | G01R 33/5615 600/410 |
| 2008/0258726 | A1 * | 10/2008 | Lamerichs | G01R 33/281 324/309 |
| 2008/0317315 | A1 * | 12/2008 | Stemmer | G01R 33/56509 382/131 |
| 2009/0085563 | A1 * | 4/2009 | Bito | G01R 33/4833 324/307 |
| 2009/0324011 | A1 * | 12/2009 | Lin | G06T 7/20 382/103 |
| 2010/0004527 | A1 * | 1/2010 | Dale | G01R 33/56341 600/410 |
| 2010/0152567 | A1 * | 6/2010 | Bryskhe | A61B 5/055 600/410 |
| 2010/0171498 | A1 * | 7/2010 | Auslender | A61B 5/055 324/309 |
| 2010/0329528 | A1 * | 12/2010 | Hajnal | A61B 5/055 382/131 |
| 2011/0043206 | A1 * | 2/2011 | Kimura | G01R 33/56341 324/309 |
| 2011/0085722 | A1 * | 4/2011 | Feiweier | G01R 33/56341 382/131 |
| 2011/0105890 | A1 * | 5/2011 | Niendorf | G01R 33/4833 600/413 |
| 2011/0181284 | A1 * | 7/2011 | Balcom | G01R 33/243 324/309 |
| 2011/0187367 | A1 * | 8/2011 | Feiweier | G01R 33/44 324/309 |
| 2011/0234223 | A1 * | 9/2011 | McColl | G01R 33/56509 324/309 |
| 2011/0241679 | A1 * | 10/2011 | Feiweier | G01R 33/56341 324/309 |
| 2011/0257510 | A1 * | 10/2011 | Weiss | A61B 5/02007 600/411 |
| 2011/0304334 | A1 * | 12/2011 | Feiweier | G01R 33/56341 324/314 |
| 2012/0049845 | A1 * | 3/2012 | Bito | G01R 33/485 324/309 |
| 2012/0068699 | A1 * | 3/2012 | Horkay | A61B 5/055 324/300 |
| 2012/0068702 | A1 * | 3/2012 | Feiweier | G01R 33/56509 324/309 |
| 2012/0259199 | A1 * | 10/2012 | Huwer | G01R 33/56341 600/410 |
| 2012/0268124 | A1 * | 10/2012 | Herbst | G01R 33/56509 324/309 |
| 2012/0274322 | A1 * | 11/2012 | Lee | G01R 33/5607 324/309 |
| 2013/0158384 | A1 * | 6/2013 | Jeong | G01R 33/5615 600/410 |
| 2013/0187649 | A1 * | 7/2013 | Bhat | A61B 5/055 324/307 |
| 2013/0229177 | A1 * | 9/2013 | Bammer | G01R 33/56341 324/309 |

(56) References Cited

U.S. PATENT DOCUMENTS

| | | | | |
|---|---|---|---|---|
| 2014/0009156 | A1* | 1/2014 | Doneva | G01R 33/5611 324/309 |
| 2014/0266195 | A1* | 9/2014 | Levin | G01R 33/56509 324/309 |
| 2014/0365244 | A1* | 12/2014 | Lee | G06F 19/321 705/3 |
| 2015/0073263 | A1* | 3/2015 | Gdaniec | G01R 33/4818 600/413 |
| 2015/0137813 | A1* | 5/2015 | Chenevert | G01R 33/56341 324/322 |
| 2015/0154741 | A1* | 6/2015 | Chen | G01R 33/543 348/77 |
| 2015/0216440 | A1* | 8/2015 | Senegas | G01R 33/543 600/408 |
| 2015/0316635 | A1* | 11/2015 | Stehning | G01R 33/56341 324/318 |
| 2016/0217570 | A1* | 7/2016 | Schadewaldt | G06T 7/0012 |
| 2017/0281041 | A1* | 10/2017 | Yokosawa | A61B 5/055 |

OTHER PUBLICATIONS

Godenschweger et al., Motion correction in MRI of the brain. Phys Med Biol. Mar. 7, 2016 (Year: 2016).*
White et al., Promo: Real-Time Prospective Motion Correction in MRI Using Image-Based Tracking. Magnetic Resonance in Medicine 63:91-105 (2010) (Year: 2010).*
Dietrich, O. et al "Reducing Motion Artefacts in Diffusion-Weighted MRI of the Brain: Efficacy of Navigator Echo Correction and Pulse Triggering", Diagnostic Neuroradiology, 2000, vol. 42, pp. 85-91.
Naganawa, Shinji et al "Diffusion-Weighted Imaging of the Liver: Technical Challenges and Prospects for the Future", Magnetic Resonance in Medical Sciences, vol. 4, No. 4, 2005, pp. 175-186.
Kober, T. et al "Prospective and Retrospective Motion Correction in Diffusion Magnetic Resonance Imaging of the Human Brian", Neuroimage , 2012, vol. 59, No. 1, pp. 389-398.
Trouard, Theodore P. et al "Analysis and Comparison of Motion-Correction Techniques in Diffusion-Weighted Imaging", Journal of Magnetic Resonance Maging, 1996. Abstract.
Taouli, Bachir et al "Evaluation of Liver Diffusion Isotropy and Characterization of Focal Hepatic Lesions with Two Single-Shot Echo-Planar MR Imaging Sequences: Prospective Study in 66 Patients", Radiology, Gastrointestinal Imaging, Jan. 2003.
Rohde, GK et al "Comprehensive Approach for Correction of Motion and Distortion in Diffusion-Weighted MRI", Magnetic Regonance in Medicine, 2004, vol. 51, No. 1, Abstract.
Kilickesmez, Ozgur et al "Non-Breath-Hold High b-Value Diffusion-Weighted MRI with Parallel Imaging Technique: Apparent Diffusion Coefficient Determination in Normal Abdominal Organs", Diagnostic and Interventional Radiology, 2008, vol. 14, pp. 83-87. Abdominal Imaging,.
Hirokawa, Yuusuke et al "MRI Artifact Reduction and Quality Improvement in the Upper Abdomen with Propeller and Prospective Acquisition Correction (PACE) Technique", AJR, MR Imaging, vol. 191, Oct. 2008, pp. 1154-1158.
Qayyum, Aliya "Diffusion-Weighted Imaging in the Abdomen and Pelvis: Concepts and Applications", Radiographics, 2009, vol. 29, No. 6, pp. 1797-1810.
Porter, David A. "2-D-Navigator-Based Re-Acquisition for Motion Artefact Suppression in Multi-Shot, Diffusion-Weighted Imaging" Proceedings of the International Society for Magnetic Resonance in Medicine, vol. 14, Apr. 2006, pp. 1047.
Porter, David A. et al "High Resolution Diffusion-Weighted Imaging using Readout-Segmented Echo-Planar Imaging, parallel Imaging and a two-Dimensional Navigator-based Reacquisition", Magnetic Resonance in Medicine, vol. 62, No. 2, May 2009, pp. 469.
Herbst, Michael et al "Prospective Motion Correction with Continuous Gradient Updates in Diffusion Weighted Imaging", Magnetic Resonance in Medicine, vol. 67, No. 2011, pp. 326-338.
Van, A.T. et al "Space and Image-Space Comination for Motion-Induced Phase-Error Correction in Self-Navigated Multicoil Multishot DWI", IEEE Transaction on Medicial Imaging, vol. 28, No. 11, Nov. 2009, pp. 1770-1780.
Anderson, A.W. et al "Analysis and Correction of Motion Artifacts in Diffusion Wighted Imaging" Magnetic Resonance in Medicine, vol. 32, No. 3, Sep. 1994, pp. 379-387.
Rief M, Wagner M, Franiel T, Bresan V, Taupitz M, Klessen C, Hamm B, Asbach P. Detection of focal liver lesions in unenhanced and ferucarbotran-enhanced magnetic resonance imaging: a comparison of T2-weighted breath-hold and respiratory-triggered sequences. Magn Reson Imaging. Nov. 2009;27(9):1223-9.
Thesen S, Heid O, Mueller E, Schad LR. Prospective acquisition correction for head motion with image-based tracking for real-time fMRI. Magn Reson Med. Sep. 2000;44(3):457-65.

* cited by examiner

MOTION DETECTION AND CORRECTION METHOD FOR MAGNETIC RESONANCE DIFFUSION WEIGHTED IMAGING (DWI)

CROSS-REFERENCE TO PRIOR APPLICATIONS

This application is the U.S. National Phase application under 35 U.S.C. § 371 of International Application No. PCT/IB2013/060691, filed on Dec. 6, 2013, which claims the benefit of U.S. Provisional Patent Application No. 61/736,099, filed on Dec. 12, 2012. These applications are hereby incorporated by reference herein.

The following relates generally to medical imaging. It finds particular application in conjunction with magnetic resonance diffusion weighted imaging and motion detection/correction, and will be described with particular reference thereto. However, it will be understood that it also finds application in other usage scenarios and is not necessarily limited to the aforementioned application.

Diffusion Weighted Imaging (DWI) is a study of microscopic movement of water molecules in tissues of the body such as a liver. Magnetic Resonance DWI generates images which show direction and distance of the microscopic movement in the tissues contrasted typically in color. Details of diffusion can reveal microscopic details of the imaged tissue which can indicate a diseased or healthy state. In a typical MRI scan of the liver in which diffusion is normally isotropic, a full set of data points for an image slice are typically acquired with a magnetic gradient field of a first amplitude and direction. The process is repeated for all three orthogonal directions. The imaging is further repeated for a variety of gradient strengths to obtain b-curve values for each voxel which show direction and rate of diffusion. A rapidly growing tumor in the liver will be evident as a restricted diffusion pattern.

However, during the imaging process, patient movement or bulk movement can overwhelm the measured diffusion by orders of magnitude. Bulk motion includes non-repetitive motion such as coughing, sneezing, shifting, etc. and/or repetitive motion such as respiration motion and cardiac motion. In addition, system navigator echoes which can normally adjust for patient movement are typically generated at the interface of the liver and the diaphragm, and are therefore not available for DWI of the liver.

One approach to addressing bulk motion in DWI has been to reorder image slices perpendicular to the motion direction. This approach may reduce image artifacts, but does not address the accuracy of the DWI measurement. Another approach has been to take the resulting spatially varying nonlinear phase into account during image reconstruction by modifying the coil sensitivity maps to reflect the different spatial-varying phase information for each diffusion direction. This approach corrects for motion artifacts, but requires a precise knowledge of the motion pattern at each voxel which is not easily available to restore the correct amount of diffusion weighting.

The following discloses a new and improved method and system for motion detection and correction in MR-DWI which addresses the above referenced issues, and others.

In accordance with one aspect, a magnetic resonance imaging system includes at least one processor configured to receive diffusion weighted imaging data based on a diffusion weighted imaging sequence with magnetic gradient fields applied in different directions and with different b-values. The at least one processor is further configured to determine motion corrupted data present in the received imaging data based on a comparison of data redundant in the received data, and substitute alternative data for determined motion corrupted data.

In accordance with another aspect, a method of magnetic resonance imaging includes receiving diffusion weighted imaging data based on a diffusion weighted imaging sequence with magnetic gradient fields applied in different directions and with different b-values. Motion corrupted data present in the received imaging data is detected based on a comparison of data redundant in the received data. Alternative data is substituted for detected motion corrupted data.

In accordance with another aspect, a magnetic resonance system includes a repetitive motion monitoring unit and a gradient motion control unit. The repetitive motion monitoring unit determines an expected time interval of repetitive motion of a subject. The gradient motion control unit adjusts for acquisition of diffusion weighted imaging data of a subject with a directional sensitivity of applied gradient fields along three axes to be sensitive orthogonal to a direction of repetitive motion during the determined time interval.

One advantage is the impact of bulk motion on diffusion measurement in MR-DWI is minimized.

Another advantage resides in avoidance of bulk repetitive motion corruption in diffusion weighted imaging.

Another advantage resides in the detection of bulk motion in diffusion weighted imaging data.

Another advantage resides in the correction of detected bulk motion in magnetic resonance diffusion weighted imaging data.

Still further advantages will be appreciated to those of ordinary skill in the art upon reading and understanding the following detailed description.

The invention may take form in various components and arrangements of components, and in various steps and arrangement of steps. The drawings are only for purposes of illustrating the preferred embodiments and are not to be construed as limiting the invention.

FIG. 1 schematically illustrates an embodiment of a diffusion weighted magnetic resonance imaging system with bulk motion detection and correction.

Figure 2:
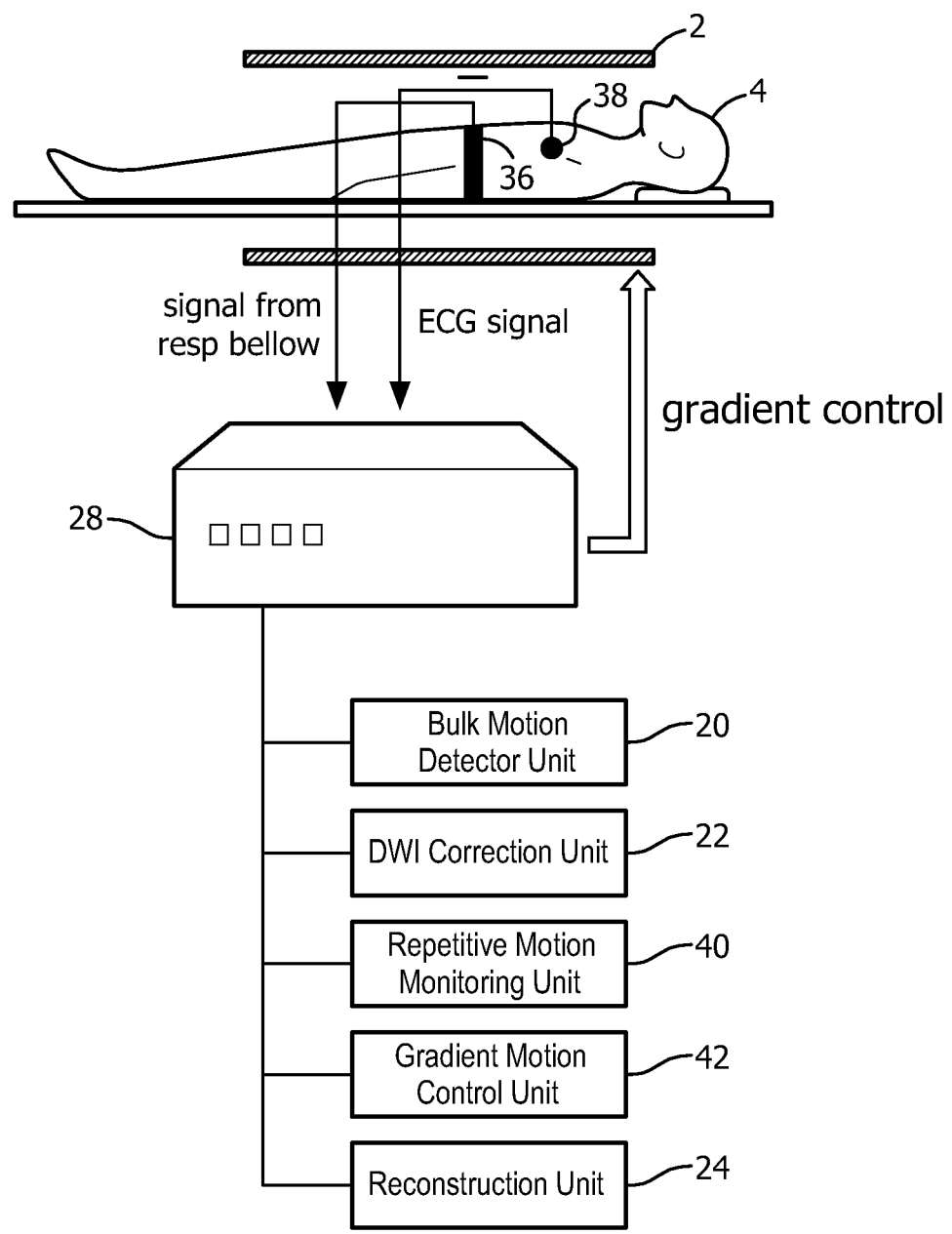

FIG. 2 schematically illustrates one embodiment of a diffusion weighted magnetic resonance imaging system which includes repetitive motion monitoring and gradient field modification.

Figure 3:
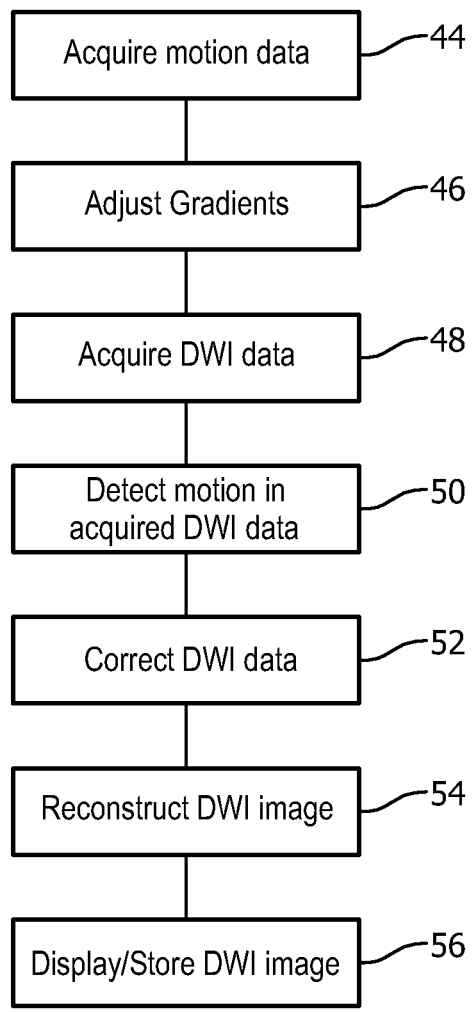

FIG. 3 flowcharts one method of using an embodiment of a diffusion weighted magnetic resonance imaging which includes bulk motion avoidance, detection, and correction.

With reference to FIG. 1, an embodiment of a magnetic resonance (MR) system 1 is schematically illustrated. The system 1 includes a MR scanner 2 such as an open system or c-type scanner, a horizontal bore scanner, and the like shown in a cross section view. The scanner includes an opening or bore that defines an examination region in which a subject 4 is placed for a spectroscopic and/or imaging examination. The MR scanner 2 includes one or more main magnets 6 with a C-shape ferrous flux return path in an open system, one or more radio frequency (RF) coils 8, and one or more gradient coils 10. A C-type main magnet 6 generates a vertical static $B_0$ field such as vertical static field. Alternatively, a bore magnet generates a horizontal static $B_0$ field.

The system 1 includes a sequence controller 12 which controls the operation of a DWI sequence, a RF transmitter unit 14 controlling the operation of the RF coils 8, and a gradient controller 16 controlling the operation of the gradient coils 10. The communication between the controlling unit and the corresponding coils can be wireless or wired. The RF coils 8 generate radio frequency pulses which excite and manipulate resonance in tissue of the subject 4. The RF coils 8 can include a whole body coil and/or a local coil such as a torso coil, hand coil, shoulder coil, knee coil, etc.

The one or more gradient coils 10 generate gradient magnetic fields across the static magnetic field and region of interest such as a liver of the subject 4 to spatially encode the induced resonance, induced gradient echoes, and the like. The gradient fields are applied across the region of interest in different directions and/or using different b-values such that data redundancy occurs from overlap in the received image data at any single voxel. The b-value represents the integral of the diffusion encoding gradient duration and strength, and is measured in sec/mm$^2$ units. The sequence controller 12 configures the RF coils and the gradient coils to excite and manipulate resonance in tissues of the subject based on a DWI sequence.

The system 1 includes a RF receiver unit 18, which receives MR-DWI signals. As the resonance decays in the tissue of the subject, weak radio frequency signals or MR-DWI signals are received by a radio frequency antenna such as the RF coils 8 and/or local coils, and sent to the RF receiver unit 18.

The system includes a bulk motion detection unit 20, a diffusion weighted imaging (DWI) correction unit 22, and a reconstruction unit 24. The bulk motion detection unit 20 receives RF data or MR-DWI data from the RF receiver and detects motion or determines motion corrupted data based on data redundancy of the received data. The detection can be applied to the MR-DWI data or a partial reconstruction of the MR-DWI data. Data redundancy exists from data received in different directional gradient fields, exponential signal decay rates, and/or similar b-values applied in different spatial directions. Comparisons can be for either direction and/or rate, and can be a single variable or multivariate.

The MR-DWI data includes data from different directional gradient fields which are applied in three orthogonal directions or include three orthogonal directions as components. The applied gradient fields are three dimensional. As a result of the different directional gradient fields, the fields overlap at individual voxels. The 3-dimensional gradient fields applied from two different directions provide enough information to measure the diffusion motion and/or to compare with a third orthogonal gradient field measure. Differences in measures which exceed a threshold amount are determined to be motion artifacted or motion corrupted.

The MR-DWI received signals along a direction and rate of movement follow a known or expected exponential signal decay rate based on the pulse sequence and applied gradient fields. A change in measured exponential signal decay rate which exceeds a threshold amount based on distance and direction of movement and the expected exponential signal decay rate are determined to be motion corrupted. The exponential signal decay rate can be included in a multivariate comparison which includes the different directional gradient fields.

The MR-DWI imaging sequence is applied with similar b-values in different directions. The b-values provide similar measures of the same diffusion movement and each b-value can be identified and associated with subsets of the MR-DWI data. The comparison with MR-DWI extrapolates or interpolates the diffusion of MR-DWI subsets of data associated with each b-value. Differences in measures from different b-values which exceed a threshold are determined to be motion corrupted. The different b-values can be included in a multivariate comparison which includes the different directional gradient fields and/or the exponential signal decay rate.

In one embodiment, measured diffusion in the MR-DWI imaging data of the liver can include a nearest neighbor comparison. For example, in three dimensions each voxel is surrounded by 26 other voxels. Although diffusion is isotropic in the liver, changes from one voxel to the next considering the surrounding voxels are relatively consistent with direction and distance changes gradual. Differences which exceed a threshold amount are determined to be motion corrupted. The nearest neighbor comparison can be included in a multivariate comparison which includes different b-values, different directional gradient fields, and/or the exponential signal decay rates.

The DWI correction unit 22 substitutes alternative data for the corrupted data. The substituted data can be based data on different directional gradient fields, different b-values, and/or modifying the DWI sequence to resample the volume with the determined motion corrupted data. The redundant data used to determine motion corruption can be used to replace the motion corrupted data. For example, any two of the different directional gradient fields can be used to determine the value of a voxel location in a third directional gradient field wherein the gradient fields are orthogonal, three dimensional, and all intersect the voxel location. MR-DWI data with different b-values can also be used instead of or in addition to the different directional gradient fields.

A reconstruction unit 24, such as a configured processor, processes the corrected MR-DWI data from the DWI correction unit 20 and reconstructs one or more images from the corrected MR-DWI such as image slices, a volume, etc. from a DWI acquisition sequence. The reconstructed MR-DWI images are motion corrected based on detected motion and substituted alternative data. The reconstructed images can be stored in a memory such as server or processor memory, local disk storage, cloud storage, and/or a storage management system such a Picture Archiving and Communication System (PACS), a Radiology Information System (RIS), and the like.

The system includes a workstation 26, which includes an electronic processor or electronic processing device 28, a display device 30 which displays the reconstructed MR-DWI images, menus, panels, and user controls, and at least one input device 32 which inputs a healthcare practitioner selections and/or commands. For example, the healthcare practitioner can select the MR-DWI image sequence from a menu displayed on the display device. The workstation 26 can be a desktop computer, a laptop, a tablet, a mobile computing device, a smartphone, and the like. The display device 30 can include a computer monitor, a touch screen, Cathode ray tube (CRT), Storage tube, Flat panel display, Light-emitting diode (LED) displays, Electroluminescent display (ELD), Plasma display panels (PDP), Liquid crystal display (LCD), Organic light-emitting diode displays (OLED), a projector, and the like. The input device 32 can be a keyboard, a mouse, a microphone, and the like.

The various units or modules 20, 22, and 24 are suitably embodied by an electronic data processing device, such as the electronic processor or electronic processing device 28 of the workstation 26, or by a network-based server computer operatively connected with the workstation 26 by a network 34, or so forth. The user interface is suitably embodied by the workstation 26. Moreover, the disclosed motion detection, motion correction, and reconstruction techniques are suitably implemented using a non-transitory storage medium storing instructions (e.g., software) readable by an electronic data processing device and executable by the electronic data processing device to perform the disclosed techniques.

With reference to FIG. 2, one embodiment of a diffusion weighted magnetic resonance imaging system 1 which includes repetitive motion monitoring and gradient field modification is schematically illustrated. The system 1 includes a MR scanner 2 with associated controlling devices (e.g. sequence control 12, gradient control 16, etc.), a reconstruction unit 24, and a monitoring device which monitors repetitive motion of the subject 4 during the MR-DWI sequence. The monitoring device can include respiratory monitor 36 and/or cardiac monitor 38. The respiratory monitor 36 such as a respiratory bellows provides the timing of the respiratory cycle. The respiratory monitor provides a signal from which an expected time interval of motion due to respiration can be determined, and an expected time interval where there is no respiratory motion. Similarly, the cardiac monitor 38 provides an ECG signal by which the cardiac cycle can be determined. The ECG signal provides expected time intervals with motion and time intervals with no motion.

The system includes a repetitive motion monitoring unit 40 and a gradient motion control unit 42. The repetitive motion monitoring unit 40 receives the respiratory signals and/or ECG signals and determines expected intervals of repetitive motion and non-repetitive motion of the subject 4. The gradient motion control unit 42 adjusts the applied gradient fields based on the determined expected intervals of repetitive motion and non-repetitive motion. The gradient fields are adjusted to be sensitive to orthogonal to the direction of motion during the time of determined repetitive motion and/or sensitive to the direction of motion during the time of determined non-repetitive motion. The gradient motion control unit communicates the determined timing and adjustment based on the MR-DWI sequence to the gradient control 16 as shown in FIG. 1. The repetitive motion monitoring unit 40, and the gradient motion control unit 42 are suitably embodied by an electronic data processing device, such as the electronic processor or electronic processing device 28 of the workstation 26, or by a network-based server computer operatively connected with the workstation 26 by a network 34, or so forth. The system 1 can include the bulk motion detection unit 20, and the DWI correction unit 22 as describe in reference to FIG. 1. The monitoring device is suitably embodied by one or more configured processors, such as the processor 28 of the workstation 26, operatively connected to either the respiratory bellows 36 and/or the ECG leads 38, and implemented using a non-transitory storage medium storing instructions. The repetitive monitoring unit 40 is suitably embodied with the monitoring device further configured to determine the anticipated interval of motion and non-motion.

FIG. 3 flowcharts one method of using an embodiment of a diffusion weighted magnetic resonance imaging which includes bulk motion avoidance, detection, and correction. In a step 44, repetitive motion data is acquired by a monitoring device such as the respiratory bellows or ECG leads as described in reference to FIG. 2. The repetitive motion monitoring unit 40 receives the respiration and/or cardiac signals and determines the time intervals of the various cycles with the associated expected time intervals of motion and non-motion. In a step 46, the applied gradient fields in the DWI sequence are adjusted based on the expected time intervals of repetitive motion and non-repetitive motion. The applied intervals are adjusted to be directionally sensitive to the repetitive motion during determined time intervals of non-motion, and directionally sensitive orthogonal to the repetitive motion during determined expected time intervals of repetitive motion. Thus, the adjustment of the gradient fields during the expected time intervals avoids bulk repetitive motion in diffusion weighted imaging.

The DWI data is acquired in a step 48 based on a diffusion weighted imaging sequence. The DWI data is acquired with gradient fields applied in three orthogonal or different directions with three different orthogonal components, and with different b-values. The DWI data is received by the RF receiver.

Bulk motion is detected in the acquired DWI data in a step 50 based on a comparison of data redundant in the acquired DWI data. The bulk motion is detected by the bulk motion detection unit 20 with acquired data received from the RF receiver based on a comparison of different directional gradient axes, exponential signal decay rates, and/or similar b-values applied in different spatial directions. The bulk motion detection unit determines locations of motion corrupted data.

The bulk motion corrupted DWI data is corrected in a step 52 by the DWI motion correction unit 22. The corrected DWI data includes a substitution of alternate data for the corrupted data with data from different gradient directions, different b-values and/or resampling the locations of the motion corrupted data.

In a step 54 the motion corrected DWI image is reconstructed by the reconstruction unit 24. The reconstructed unit reconstructs the image from the corrected DWI data. The motion corrected DWI image can be displayed on a display device 30 and/or stored in a storage management system in a step 56.

It is to be appreciated that in connection with the particular illustrative embodiments presented herein certain structural and/or function features are described as being incorporated in defined elements and/or components. However, it is contemplated that these features may, to the same or similar benefit, also likewise be incorporated in other elements and/or components where appropriate. It is also to be appreciated that different aspects of the exemplary embodiments may be selectively employed as appropriate to achieve other alternate embodiments suited for desired applications, the other alternate embodiments thereby realizing the respective advantages of the aspects incorporated therein.

It is also to be appreciated that particular elements or components described herein may have their functionality suitably implemented via hardware, software, firmware or a combination thereof. Additionally, it is to be appreciated that certain elements described herein as incorporated together may under suitable circumstances be stand-alone elements or otherwise divided. Similarly, a plurality of particular functions described as being carried out by one particular element may be carried out by a plurality of distinct elements acting independently to carry out individual functions, or certain individual functions may be split-up and carried out by a plurality of distinct elements acting in concert. Alternately, some elements or components otherwise described and/or shown herein as distinct from one another may be physically or functionally combined where appropriate.

In short, the present specification has been set forth with reference to preferred embodiments. Obviously, modifications and alterations will occur to others upon reading and understanding the present specification. It is intended that the invention be construed as including all such modifications and alterations insofar as they come within the scope of the appended claims or the equivalents thereof. That is to say, it will be appreciated that various of the above-disclosed and other features and functions, or alternatives thereof, may be desirably combined into many other different systems or applications, and also that various presently unforeseen or unanticipated alternatives, modifications, variations or improvements therein may be subsequently made by those skilled in the art which are similarly intended to be encompassed by the following claims.

What is claimed is:

1. A magnetic resonance imaging system, comprising: at least one processor programmed to: receive diffusion weighted imaging data from a region of interest of a subject based on a diffusion weighted imaging sequence with magnetic gradient fields applied in different directions and with different b-values; detect motion corrupted data present in the received imaging data based on a comparison of data redundant in the received data, the data redundancy existing from the diffusion weighted imaging data received for the magnetic gradient fields applied in three orthogonal directions, the motion corrupted data being detected by comparing the diffusion weighted imaging data from two of the three orthogonal directions with the diffusion weighted imaging data from a third orthogonal gradient field measure of a third of the three orthogonal directions; and substitute alternative data for detected motion corrupted data.

2. The system according to claim 1, wherein the at least one processor is further programmed to determine a direction of repetitive motion based on the comparison of data redundant in the received diffusion weighted imaging data, and wherein the system further comprises: a repetitive motion monitoring unit which determines a time interval of expected repetitive motion of a subject; and a gradient motion control unit which adjusts for acquisition of the diffusion weighted imaging data directional sensitivity of applied gradient fields to be sensitive orthogonal to the direction of the repetitive motion during the determined time interval.

3. The system according to claim 2, wherein the gradient motion control unit adjusts the directional sensitivity of the applied gradients fields to be sensitive in the direction of repetitive motion during an interval when no repetitive motion is expected.

4. The system according to claim 2, wherein the repetitive motion monitoring unit includes at least one of: a respiratory monitor operatively connected to the subject and configured to determine time intervals of respiratory motion; and an electrocardiogram monitor operatively connected to the subject and configured to determine time intervals of cardiac motion.

5. The system according to claim 1, wherein the compared redundant data includes data from exponential signal decay rates.

6. The system according to claim 5, wherein the compared redundant data includes data with similar b-values applied in different spatial directions.

7. The system according to claim 1, wherein the diffusion weighted imaging sequence is modified to resample locations of the motion corrupted data.

8. A method of magnetic resonance imaging, comprising: receiving diffusion weighted imaging data from a region of interest of a subject based on a diffusion weighted imaging sequence with magnetic gradient fields applied in three orthogonal directions and with different b-values; detecting motion corrupted data present in the received imaging data based on a comparison of data redundant in the received data, the data redundancy existing from the diffusion weighted imaging data received for the magnetic gradient fields applied in the three orthogonal directions, the motion corrupted data being detected by comparing the diffusion weighted imaging data from two of the three orthogonal directions with the diffusion weighted imaging data from a third orthogonal gradient field measure of a third of the three orthogonal directions; and substituting alternative redundant data from the received data for detected motion corrupted data.

9. The method according to claim 8, further comprising: determining an expected time interval of repetitive motion of a subject; and adjusting acquisition of the diffusion weighted imaging data directional sensitivity of applied gradient fields to be sensitive orthogonal to a direction of the repetitive motion during the determined time interval, the direction being determined based on the comparison of data redundant in the received diffusion weighted imaging data.

10. The method according to claim 8, further comprising: determining an expected time interval of repetitive motion of a subject; and adjusting the directional sensitivity of the applied gradients fields to be sensitive in the direction of repetitive motion during an interval when no repetitive motion is expected.

11. The method according to claim 8, wherein the compared redundant data includes data from at least one of: different directional gradients; exponential signal decay rates; or similar b-values applied in different spatial directions.

12. The method according to claim 8, wherein the substituted alternative redundant data includes received data with different directional gradient fields and/or different b-values compared with the detected motion corrupted data.

13. A non-transitory computer-readable storage medium carrying software which controls one or more electronic data processing devices to perform the method according to claim 12.

14. An electronic data processing device configured to perform the method according to claim 12.

15. A magnetic resonance system, comprising: a processor programmed to: receive diffusion weighted imaging data based on a diffusion weighted imaging sequence with magnetic gradient fields applied in different directions and with different b-values; detect motion corrupted data present in the received imaging data based on a comparison of data redundant in the received data, the data redundancy existing from the diffusion weighted imaging data received for the magnetic gradient fields applied in the three orthogonal directions, the motion corrupted data being detected by comparing the diffusion weighted imaging data from two of the three orthogonal directions with the diffusion weighted imaging data from a third orthogonal gradient field measure of a third of the three orthogonal directions; and substitute alternative data for detected motion corrupted data; a repetitive motion monitoring unit which determines an expected time interval of repetitive motion of a subject; and a gradient motion control unit which adjusts for acquisition of the diffusion weighted imaging data of the subject with a directional sensitivity of the applied magnetic gradient fields along three axes to be sensitive orthogonal to a direction of repetitive motion during the determined time interval.

16. The system according to claim 15, wherein the repetitive motion monitoring unit includes at least one of: a respiratory monitor operatively connected to the subject which determines time intervals of respiratory motion; or an electrocardiogram monitor operatively connected to the subject which determines time intervals of cardiac motion.

17. The system according to claim 15, wherein the processor is further programmed to: determine a direction of repetitive motion based on the comparison of data redundant in the received diffusion weighted imaging data.

18. The system according to claim 15, wherein the processor is further programmed to: determine an expected time interval of repetitive motion of a subject; and adjust acquisition of the diffusion weighted imaging data directional sensitivity of applied gradient fields to be sensitive orthogonal to a direction of the repetitive motion during the determined time interval, the direction being determined based on the comparison of data redundant in the received diffusion weighted imaging data.

19. The system according to claim 15, wherein the processor is further programmed to: determine an expected time interval of repetitive motion of a subject; and adjust the directional sensitivity of the applied gradients fields to be sensitive in the direction of repetitive motion during an interval when no repetitive motion is expected.

20. The system according to claim 15, wherein the region of interest is a liver.

* * * * *